(12) United States Patent
Yoshida et al.

(10) Patent No.: US 12,064,878 B2
(45) Date of Patent: Aug. 20, 2024

(54) SUBSTRATE TRANSFERRING ROBOT AND METHOD OF CONTROLLING THE SUBSTRATE TRANSFERRING ROBOT

(71) Applicant: Kawasaki Jukogyo Kabushiki Kaisha, Kobe (JP)

(72) Inventors: Hiroyuki Yoshida, Kobe (JP); Yukimasa Yamada, Kobe (JP); Shinya Kitano, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 305 days.

(21) Appl. No.: 17/622,871

(22) PCT Filed: Jun. 17, 2020

(86) PCT No.: PCT/JP2020/023765
§ 371 (c)(1),
(2) Date: Dec. 27, 2021

(87) PCT Pub. No.: WO2020/262145
PCT Pub. Date: Dec. 30, 2020

(65) Prior Publication Data
US 2022/0241968 A1 Aug. 4, 2022

(30) Foreign Application Priority Data
Jun. 28, 2019 (JP) .................. 2019-121508

(51) Int. Cl.
*H02N 15/00* (2006.01)
*B25J 9/04* (2006.01)
(Continued)

(52) U.S. Cl.
CPC .............. *B25J 9/1664* (2013.01); *B25J 9/04* (2013.01); *B25J 11/0095* (2013.01); *B25J 13/088* (2013.01)

(58) Field of Classification Search
CPC ........ B25J 9/1664; B25J 9/04; B25J 11/0095; B25J 13/088; B25J 9/1612; B25J 9/1656;
(Continued)

(56) References Cited

U.S. PATENT DOCUMENTS 10,493,620 B2 * 12/2019 Caveney .............. B25J 11/0095
10,549,427 B1 * 2/2020 Yoshida ............ H01L 21/67766
(Continued)

FOREIGN PATENT DOCUMENTS

CN 103193085 A 7/2013
JP 2011-159738 A 8/2011
(Continued)

OTHER PUBLICATIONS

Machine translation of WO 2017155094A1, Hirat et al., Sep. 14, 2017 (Year: 2017).*
(Continued)

*Primary Examiner* — Vinh Luong
(74) *Attorney, Agent, or Firm* — XSENSUS LLP

(57) ABSTRACT

A robot controlling part (41) of a substrate transferring robot performs an operation regulating control when a substrate is placed on a substrate placing part (12*a*). The operation regulating control is a control in which a hand (12) is moved in accordance with an operation plan that regulates the movement of the hand in a regulation target section (A) where the hand is moved to have a vertical acceleration component exceeding a given first threshold (L1), the movement of the hand including at least one of a horizontal velocity component exceeding a given second threshold (L2) and an acceleration component exceeding a given third threshold.

1 Claim, 9 Drawing Sheets

(51) Int. Cl.
      *B25J 9/16*        (2006.01)
      *B25J 11/00*      (2006.01)
      *B25J 13/08*      (2006.01)
      *H01F 7/10*       (2006.01)

(58) Field of Classification Search
      CPC .......... B25J 9/042; G05B 2219/45031; H01L 21/677; H01L 21/67745; H01L 21/67742; H01L 21/68707
      See application file for complete search history.

(56) References Cited

U.S. PATENT DOCUMENTS

| | | |
|---|---|---|
| 2013/0178979 A1 | 7/2013 | Kimura et al. |
| 2013/0190924 A1 | 7/2013 | Kimura |
| 2017/0341240 A1* | 11/2017 | Nakaya .................... G05B 9/02 |
| 2020/0070349 A1* | 3/2020 | Yoshida ................ B25J 9/1612 |
| 2022/0359261 A1* | 11/2022 | Yoshida ................ B25J 13/089 |

FOREIGN PATENT DOCUMENTS

| | | | |
|---|---|---|---|
| JP | 2012-49357 A | 3/2012 | |
| JP | 2013-151034 A | 8/2013 | |
| WO | WO 2017155094 A1 * | 9/2017 | ............. H05K 13/04 |

OTHER PUBLICATIONS

Define frictional force, Microsoft Bing, Dec. 24, 2023 (Year: 2023).*
Define acceleration, Microsoft Bing, Dec. 24, 2023 (Year: 2023).*
Friction, Wikipedia, Dec. 24, 2023 (Year: 2023).*

\* cited by examiner

SUBSTRATE TRANSFERRING ROBOT AND METHOD OF CONTROLLING THE SUBSTRATE TRANSFERRING ROBOT

CROSS-REFERENCE TO RELATED APPLICATIONS

The present application is based on PCT filing PCT/JP2020/023765, filed Jun. 17, 2020, which claims priority to JP 2019-121508, filed Jun. 28, 2019, the entire contents of each are incorporated herein by reference.

TECHNICAL FIELD

The present disclosure relates to a substrate transferring robot and a method of controlling the substrate transferring robot.

BACKGROUND ART

Conventionally, devices capable of suppressing a positional deviation of a wafer transferred by a robotic arm are known (for example, see Patent Document 1).

This device reduces an acceleration of the arm, when the positional deviation of the wafer is determined to be exceeding a given amount.

REFERENCE DOCUMENT OF CONVENTIONAL ART

Patent Document

[Patent Document 1] JP2012-049357A

DESCRIPTION OF THE DISCLOSURE

Problem to be Solved by the Disclosure

However, there is a problem that the device disclosed in Patent Document 1 is difficult to prevent the occurrence of the positional deviation of the wafer.

SUMMARY OF THE DISCLOSURE

In order to solve the problem, a substrate transferring robot according to one aspect of the present disclosure includes a robot body having a robotic arm, the robotic arm being comprised of one or more links coupled to each other by one or more joints, and the robotic arm being provided at a tip-end part thereof with a hand having a substrate placing part where a substrate is placed, and a robot controlling part configured to control the robotic arm to move the hand from a given starting point to a given ending point. When the substrate is placed on the substrate placing part, the robot controlling part performs an operation regulating control in which the hand is moved in accordance with an operation plan that regulates the movement of the hand in a regulation target section where the hand is moved to have a vertical acceleration component exceeding a given first threshold, the movement of the hand including a horizontal velocity component exceeding a given second threshold or the acceleration component.

According to this, the occurrence of a positional deviation of the substrate placed on the substrate placing part is suppressed beforehand.

Effect of the Disclosure

The present disclosure has the effect of preventing the occurrence of a positional deviation of a substrate placed on a substrate placing part.

MODES FOR CARRYING OUT THE DISCLOSURE

Figure 1:
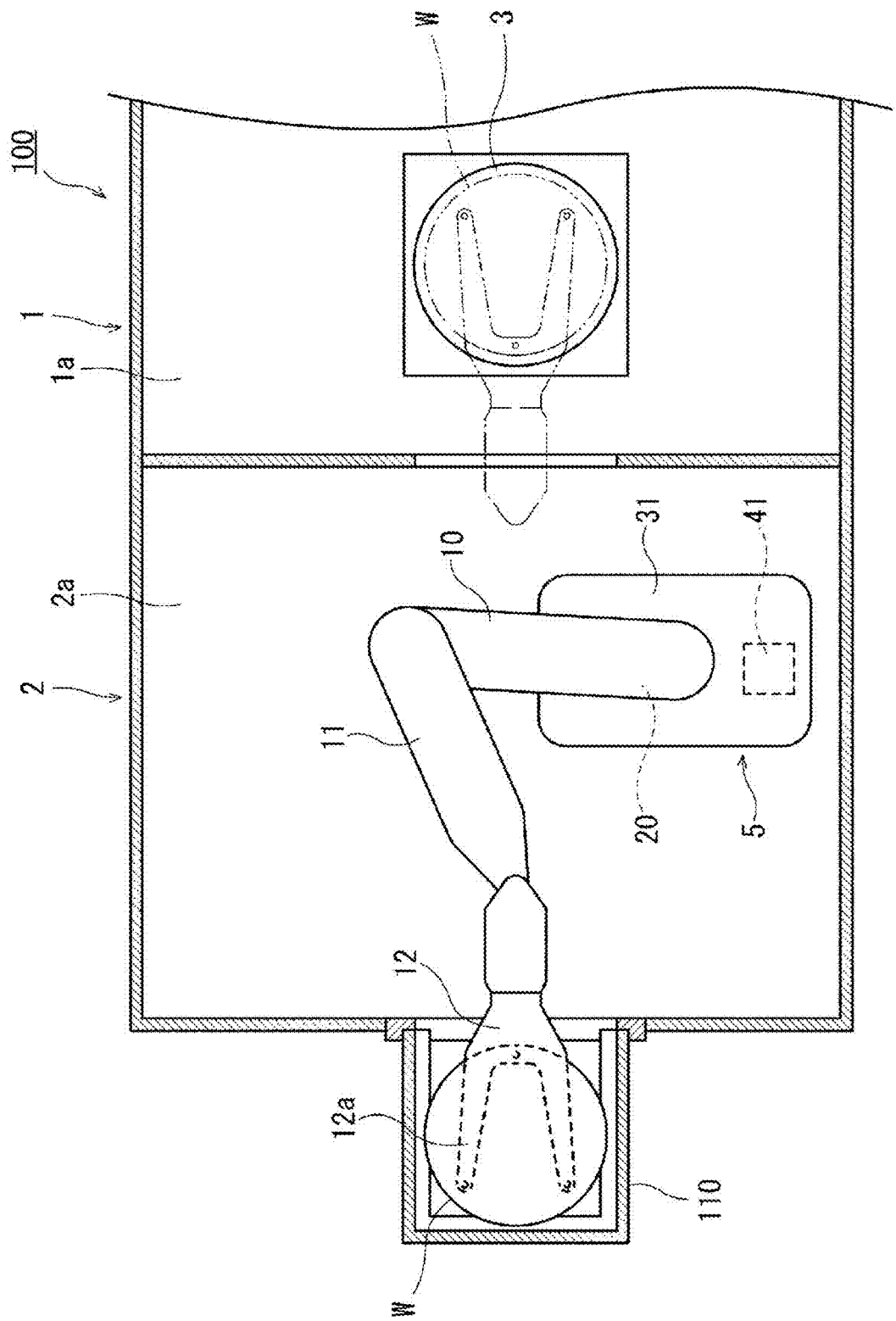
FIG. 1 is a plan view illustrating one example of a configuration of a substrate processing system according to one embodiment.

A substrate transferring robot according to one aspect includes a robot body having a robotic arm, the robotic arm being comprised of one or more links coupled to each other by one or more joints, and the robotic arm being provided at a tip-end part thereof with a hand having a substrate placing part where a substrate is placed, and a robot controlling part configured to control the robotic arm to move the hand from a given starting point to a given ending point. The robot controlling part performs an operation regulating control, when the substrate is placed on the substrate placing part. The operation regulating control is a control in which the hand is moved in accordance with an operation plan that regulates the movement of the hand in a regulation target section where the hand is moved to have a vertical acceleration component exceeding a given first threshold, the movement of the hand including at least one of a horizontal velocity component exceeding a given second threshold and an acceleration component exceeding a given third threshold.

Therefore, the occurrence of a positional deviation of the substrate placed on the substrate placing part is suppressed beforehand.

The robot controlling part may perform a normal control, when the substrate is not placed on the substrate placing part, and the normal control may be a control in which the hand is moved in accordance with an operation plan that permits the movement of the hand in the regulation target section, the movement of the hand including at least one of the horizontal velocity component exceeding the second threshold and the acceleration component exceeding the third threshold.

Therefore, when the substrate is not placed on the substrate placing part, the hand can be promptly moved to the ending point.

A path linearly connecting the starting point and the ending point may have movement components in the horizontal direction and the vertical direction.

Therefore, the occurrence of the positional deviation of the substrate placed on the substrate placing part is suppressed appropriately.

The robot controlling part may perform the operation regulating control when a given path is settable, the given path where the hand does not interfere with surrounding environment when the hand is moved from the starting point to the ending point, and the operation of the hand includes an operation having velocity components in the horizontal direction and the vertical direction.

Therefore, the occurrence of the positional deviation of the substrate placed on the substrate placing part is suppressed appropriately.

The hand may hold the substrate by a frictional force.

Therefore, it is suppressed that the positional deviation of the substrate placed on the substrate placing part occurs in the hand in which the occurrence of the positional deviation of the substrate tends to easily become remarkable (e.g., a passive hand).

The operation regulating control may be a control in which the hand is moved in accordance with the operation plan that permits the movement of the hand in a no-regulating section where the hand is moved to have the vertical acceleration component of the first threshold or less, the movement of the hand including at least one of the horizontal velocity component exceeding the second threshold and the acceleration component exceeding the third threshold.

Therefore, the hand can be promptly moved to the ending point.

The starting point may be a position at which the substrate is placed on the substrate placing part, and the ending point may be a position at which the substrate placed on the substrate placing part is unloaded.

Therefore, the transferring of the hand can be promptly performed.

The robot body may be a horizontal articulated robot.

Therefore, the positional deviation of the substrate placed on the substrate placing part by using the horizontal articulated robot, is suppressed.

In the operation regulating control, the path where the hand is moved from the starting point to the ending point may include a path where a section to move the hand in the horizontal direction and a section to move the hand in the vertical direction continuously alternate for more than twice.

Therefore, the occurrence of the positional deviation of the substrate placed on the substrate placing part is suppressed effectively.

A method of controlling a substrate transferring robot according to another aspect is a method of controlling a substrate transferring robot configured to move a hand of the substrate transferring robot from a given starting point to a given ending point. The method includes the step of, when a straight-line path, where the hand is moved linearly from the starting point to the ending point without interfering with surrounding environment, is settable, moving the hand along a path including a section to move the hand in the horizontal direction and a section to move the hand in the vertical direction, but different from the straight-line path.

Therefore, the occurrence of a positional deviation of the substrate placed on the substrate placing part is suppressed beforehand.

A method of controlling a substrate transferring robot according to another aspect is a method of controlling a substrate transferring robot configured to move a hand of the substrate transferring robot from a given starting point to a given ending point. The method includes the step of, when a straight-line path, where the hand is moved linearly from the starting point to the ending point without interfering with surrounding environment, is settable, moving the hand along an actual moving path different from the straight-line path. A minimum value of a deviation resistance coefficient expressed by the following formula while moving the hand along the actual moving path is larger than a minimum value of the deviation resistance coefficient while moving the hand along a linear path from the starting point to the ending point:

[a deviation resistance coefficient]=[a static friction coefficient between the substrate placed on the hand and the hand]×[a vertical acceleration of the substrate]−[a horizontal acceleration of the substrate].

Therefore, the occurrence of a positional deviation of the substrate placed on the substrate placing part is suppressed beforehand.

Hereinafter, one embodiment is described with reference to the drawings. Note that the present disclosure is not limited by this embodiment. Further, below, throughout the drawings, the same reference characters are assigned to the same or corresponding elements to omit redundant description.

FIG. 1 is a plan view illustrating one example of a configuration of a substrate processing system 100 according to this embodiment.

As illustrated in FIG. 1, the substrate processing system 100 includes substrate processing equipment 1 and substrate transferring equipment 2. The substrate processing system 100 takes out a wafer W transferred to this system 100 from a carrier 110 and transfers it to a stage 3 of the substrate processing equipment 1, by using the substrate transferring equipment 2, where the carrier 110 is a so-called "FOUP (Front Opening Unified Pod)" and accommodates a plurality of wafers W. Then, processing which is defined beforehand is applied to the wafer W in the substrate processing equipment 1. Then, after the processing which is defined beforehand is applied to the wafer W, the substrate transferring equipment 2 transfers the wafer W to the carrier 110 from the stage 3, and again accommodates it in the carrier 110. In order to prevent adhesion of particles to the wafer W during the processing, the substrate processing system 100 includes a device (not illustrated) for keeping a high air cleanliness class of a treatment space 1a of the substrate processing equipment 1 and a preparation space 2a of the substrate transferring equipment 2. Note that the substrate processed by the substrate processing system 100 is not limited to the wafer, but may be a glass substrate.

Figure 2:
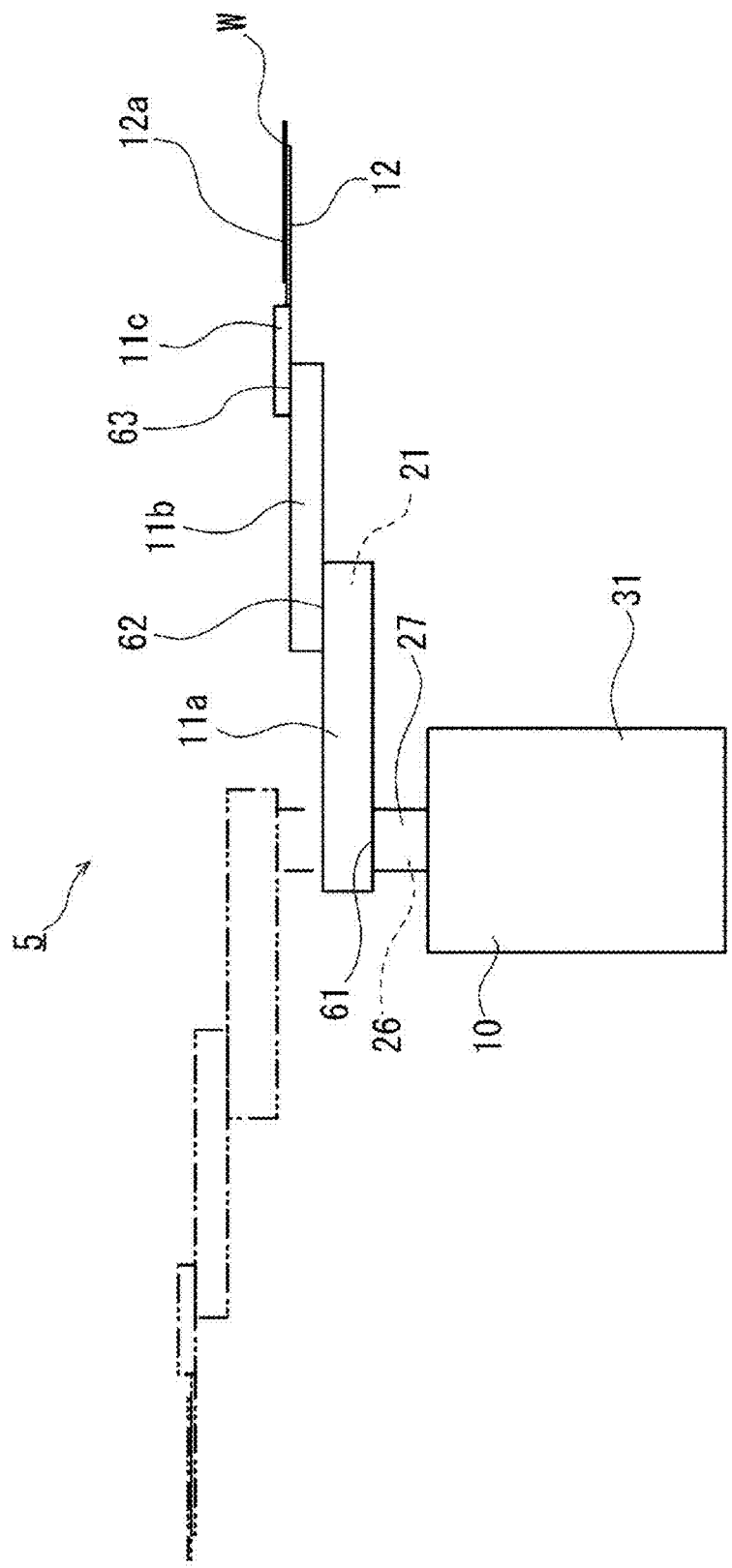
FIG. 2 is an elevational view illustrating one example of a configuration of a substrate transferring robot of the substrate processing system of FIG. 1.

FIG. 2 is an elevational view illustrating one example of a configuration of a substrate transferring robot 5 of the substrate transferring equipment 2.

The substrate transferring equipment 2 is equipment which transfers the wafer W between the carrier 110 and the stage 3, and includes the substrate transferring robot 5.

The substrate transferring robot 5 is a robot disposed in the preparation space 2a of the substrate transferring equipment 2, and, for example, is a horizontal articulated robot of scalar type. As illustrated in FIG. 2, the substrate transferring robot 5 includes a robot body 10 and a robot controlling part 41.

The substrate transferring robot 5 includes a robotic arm 11, a hand 12, a robotic arm drive mechanism 20, and a base 31.

The base 31 is fixed to the preparation space 2a of the substrate transferring equipment 2.

The robotic arm 11 is configured so that one or more links are coupled via joint(s) and the hand 12 is provided to a tip-end part thereof. As illustrated in FIG. 2, the robotic arm 11 is provided with a plurality of links (a first link 11a, a second link 11b, and a third link 11c) which are serially coupled in a direction from a base-end part toward the tip-end part via the joints. Each link is formed in a hollow thick plate shape extending horizontally.

The first link 11a is rotatably coupled at its base-end part to an upper end part of a movable part 27 of a vertical drive mechanism 26 (described later) via a first joint 61. The second link 11b is rotatably coupled at its base-end part to a tip-end part of the first link 11a via a second joint 62. Further, the third link 11c is rotatably coupled at its base-end part to a tip-end part of the second link 11b via a third joint 63. Then, the hand 12 is fixed to a tip-end part of the third link 11c. Rotation shafts of the joints extend in the up-and-down direction in parallel to each other, and the hand 12 moves horizontally by rotation of the joints 61, 62, and 63. For example, the joints 61, 62, and 63 are each fixed at the rotation shaft to one of a pair of links coupled via the joint (including the movable part 27 of the vertical drive mechanism 26), and the rotation shaft is rotatably supported by the other link via a bearing.

The hand (blade) 12 is a passive hand which holds the wafer W placed thereon by a frictional force, and has a substrate placing part 12a which is formed in a thin plate shape extending horizontally, where the wafer W is placed on an upper surface thereof. The passive hand which holds the wafer W by frictional force tends to produce a positional deviation of the substrate due to influences of the inertia force proportional to the acceleration, and the centrifugal force and the wind pressure proportional to the square of the velocity, for example. Alternatively, the hand 12 may be a suction hand, such as a Bernoulli hand, which sucks and holds the wafer W such as a workpiece, or an edge grip hand which grasps the edge of the wafer W.

The robotic arm drive mechanism 20 is a mechanism which moves the hand 12 horizontally and moves the entire robotic arm 11 in the up-and-down direction. The robotic arm drive mechanism 20 includes a horizontal drive mechanism 21 and the vertical drive mechanism 26.

The horizontal drive mechanism 21 is a mechanism which drives each joint of the robotic arm 11, and, for example, includes a servo motor provided in the interior space of the robotic arm 11 corresponding to the joint, and a plurality of gears which transmit a rotation angle of the motor to the joint. The vertical drive mechanism 26 is a mechanism which supports the robotic arm 11, and raises and lowers the entire robotic arm 11. The vertical drive mechanism 26 includes a fixed part (not illustrated) fixed to the base 31, the movable part 27 coupled to the fixed part so as to be movable in a vertical direction and the opposite direction to the vertical direction (hereinafter, simply referred to as "the up-and-down direction"), a servo motor, and a ball-screw mechanism which converts a driving force of the motor into a straight-movement force of the movable part 27 with respect to the fixed part, and transmits it to the movable part 27 to raise and lower the movable part 27.

The robot controlling part 41 controls the robotic arm drive mechanism 20 according to a movement command inputted by a given operation program or user. Therefore, the robot controlling part 41 controls the robotic arm 11 to move the hand 12 from a given starting point Ps to a given ending point Pe (see FIG. 4). For example, the robot controlling part 41 includes a control unit having a processor such as a CPU, and a memory part having a memory, such as a ROM and a RAM. The controller may be comprised of a sole controller which carries out a centralized control, or may be comprised of a plurality of controllers which collaboratively carry out a distributed control. The memory part stores a moving path Rt associated with a normal control (described later), and a moving path R associated with an operation regulating control. These moving paths R and Rt are operation plans taught beforehand, when the starting point Ps and the ending point Pe are determined.

Example Operation 1

Next, Example Operation 1 of the substrate transferring robot 5 of the substrate processing system 100 is described. In Example Operation 1, the robot controlling part 41 moves it on the moving path R in which the ending point Pe is set above the starting point Ps.

Figure 3:
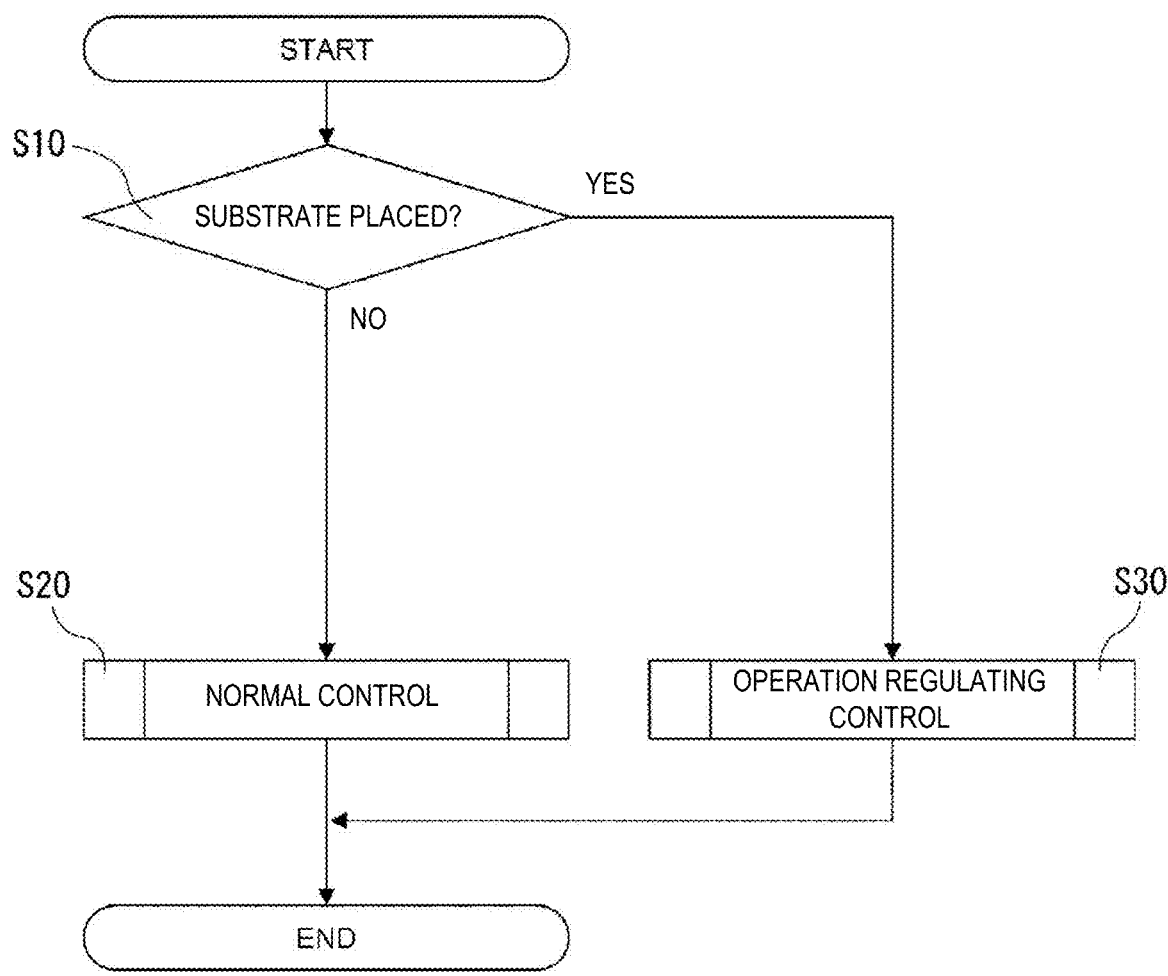
FIG. 3 is a flowchart illustrating Example Operation 1 of the substrate transferring robot of the substrate processing system of FIG. 1.
Figure 4A:
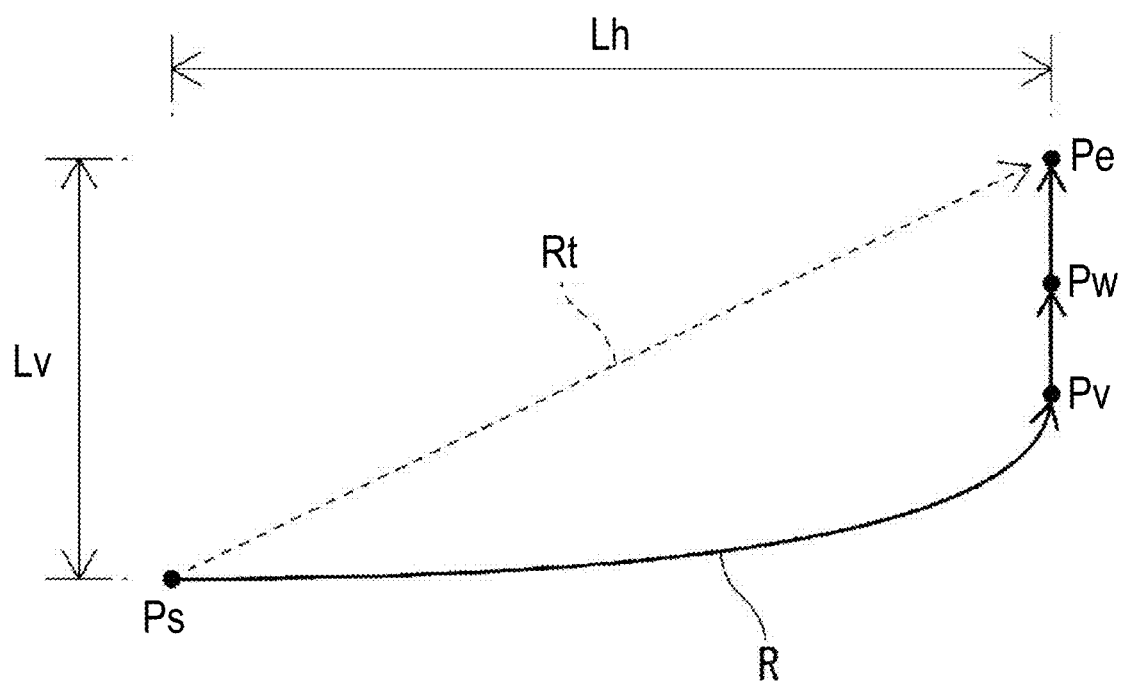
FIG. 4A is a view illustrating a moving path of a hand of the substrate transferring robot in Example Operation 1 of the substrate transferring robot of the substrate processing system of FIG. 1.
Figure 4B:
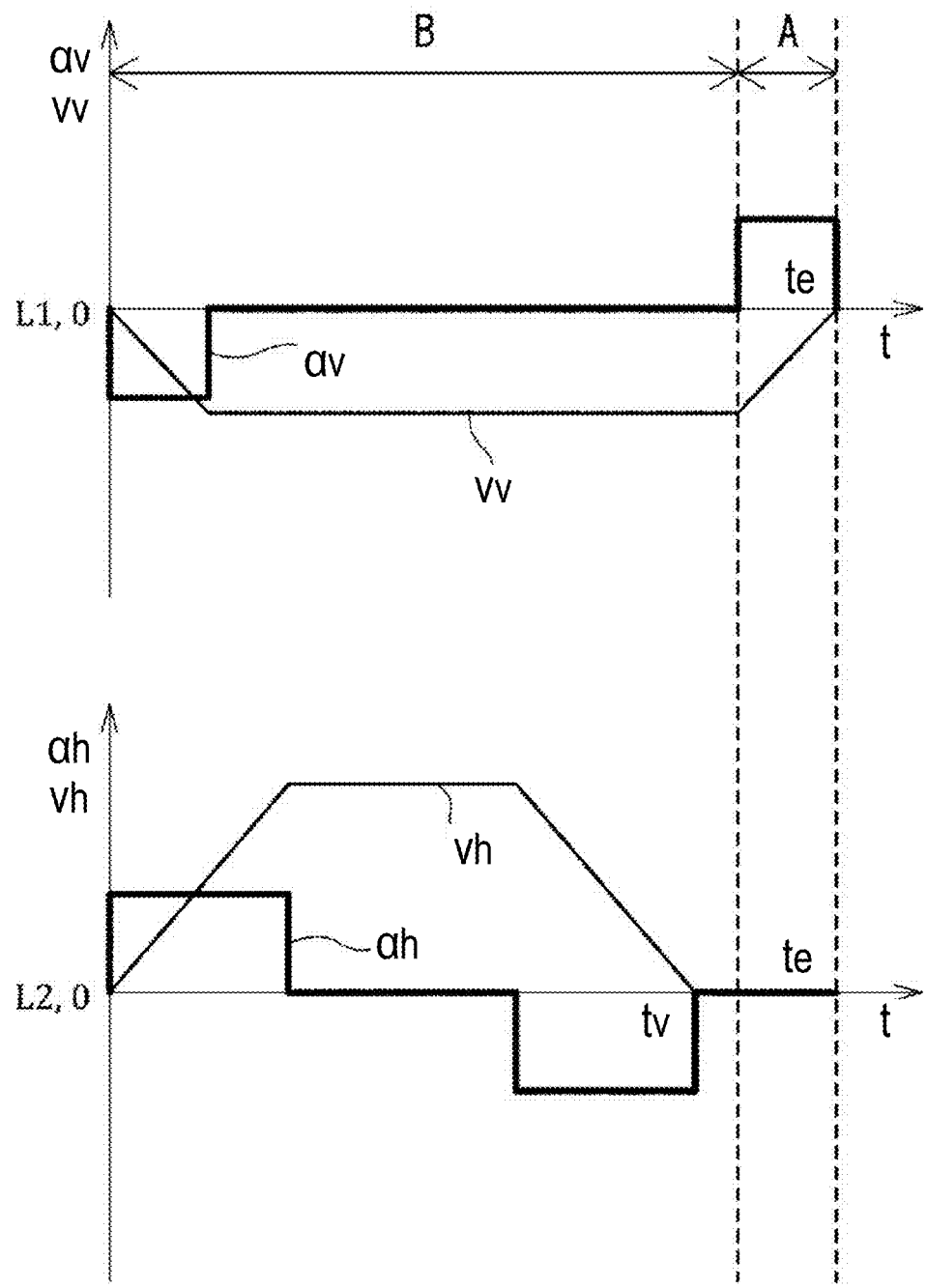
FIG. 4B is a view illustrating temporal changes in a velocity component and an acceleration component in the vertical direction of the hand of the substrate transferring robot which moves on the moving path of FIG. 4A, and temporal changes in a velocity component and an acceleration component in the horizontal direction.

FIG. 3 is a flowchart illustrating Example Operation 1 of the substrate transferring robot 5. FIG. 4A is a view illustrating the moving path R of the hand 12 of the substrate transferring robot 5 in Example Operation 1. FIG. 4B is a view illustrating temporal changes in a velocity component vv and an acceleration component av in the vertical direction of the hand 12 which moves on the moving path R illustrated in FIG. 4A, and temporal changes in a velocity component vh and an acceleration component ah in the horizontal direction. Note that, in the upper graph of FIG. 4B, values of the velocity component vv and the acceleration component av in the vertical direction (i.e., downward) are illustrated to be larger as it goes to upward in the vertical axis. Further, in the lower graph of FIG. 4B, values of the velocity component vh and the acceleration component ah in a direction approaching the ending point Pe are illustrated to be larger as it goes to upward in the vertical axis.

First, the robot controlling part 41 raises the hand 12, after locating the substrate placing part 12a immediately below the wafer W, which is a target to be transferred, accommodated in the carrier 110, and takes up the wafer W. Thus, the wafer W is placed on the substrate placing part 12a, and the wafer W is held by the hand 12. At this time, the movement of the wafer W in the horizontal direction is regulated by the frictional force. The position at which the wafer W is placed on the substrate placing part 12a is the starting point Ps of the moving path R.

Next, the robot controlling part 41 moves the hand 12 toward the ending point Pe of the moving path R. This ending point Pe is a position which is set on the stage 3 and where the wafer W placed on the substrate placing part 12a is unloaded (handed to the substrate processing equipment 1).

At this time, the robot controlling part 41 first determines whether the wafer W is placed on the substrate placing part 12a (Step S10).

Then, if the robot controlling part 41 determines that the wafer W is not placed on the substrate placing part 12a (No at Step S10), it performs the normal control (Step S20). In the normal control, the robot controlling part 41 moves the hand 12 on the moving path Rt associated with the normal control. This moving path Rt is the shortest route connecting the starting point Ps and the ending point Pe with a straight line, and the robot controlling part 41 moves the hand 12 obliquely upward in the normal control. That is, the robot controlling part 41 moves the hand 12, while permitting the movement of the hand 12 (details will be described later) including the horizontal velocity component vh in a regulation target section A. Therefore, when the wafer W is not placed on the substrate placing part 12a, the hand 12 can be promptly moved to the ending point Pe.

On the other hand, if the robot controlling part 41 determines that the wafer W is placed on the substrate placing part 12a (Yes at Step S10), it performs the operation regulating control (Step S30). In the operation regulating control, the robot controlling part 41 moves it on the moving path R associated with the operation regulating control.

The moving path R associated with the operation regulating control is a path, for example, illustrated in FIG. 4A. When moving the hand 12 on the moving path R illustrated in FIG. 4A, the robot controlling part 41 first controls the vertical drive mechanism 26 to raise the movable part 27, and, at the same time, it controls the horizontal drive mechanism 21 to move the hand 12 horizontally toward the ending point Pe so that the hand 12 is moved toward a waypoint Pv which is set below the ending point Pe by the robot controlling part 41. At this time, as illustrated in the upper graph of FIG. 4B, the robot controlling part 41 controls the vertical drive mechanism 26 to accelerate the movable part 27 toward the ending point Pe upward (the direction opposite to the vertical direction, the downward direction in the vertical axis of the upper graph of FIG. 4B), and, after that, when the speed reaches a target speed, it stops the acceleration of the movable part 27. That is, the value of the acceleration component av in the vertical direction of the hand 12 has a negative value for a certain period of time from the starting time of the movement, and it then changes to 0. Further, at the same time, as illustrated in the lower graph of FIG. 4B, the robot controlling part 41 controls the horizontal drive mechanism 21 to accelerate the hand 12 in the direction toward the ending point Pe, and, after that, when the speed reaches the target speed, it stops the acceleration of the hand 12. That is, the value of the horizontal acceleration component ah toward the ending point Pe of the hand 12 has a positive value for a certain period of time from the starting time of the movement, and it then changes to 0.

Next, when it approaches the waypoint Pv, as illustrated in the lower graph of FIG. 4B, the robot controlling part 41 controls the horizontal drive mechanism 21 to slow down the horizontal moving speed of the hand 12, and then stops the horizontal movement of the hand 12 at a timing tv when the hand 12 reaches the waypoint Pv. That is, the value of the horizontal acceleration component ah toward the ending point Pe of the hand 12 changes from 0 to the negative value at the timing when the slowdown is started, and, after that, it changes to 0 at the timing tv when the hand 12 reaches the waypoint Pv. Then, when the hand 12 exceeds the waypoint Pv and moves in the section between the waypoint Pv and the ending point Pe, it does not have the horizontal velocity component vh, but has the upward velocity component vv (the opposite direction to the vertical direction).

Next, when the hand 12 approaches the ending point Pe, as illustrated in the upper graph of FIG. 4B, the robot controlling part 41 controls the vertical drive mechanism 26 to slow down the moving speed of the movable part 27 (the moving speed of the hand 12 in the up-and-down direction), and stops the hand 12 when arriving at the ending point Pe. That is, the value of the vertical acceleration component av of the hand 12 changes from 0 to the positive value at the start timing of the slowdown, and it then changes to 0 at the timing to at which the hand 12 arrived at the ending point Pe.

The section between a slowdown starting point Pw and the ending point Pe, within which the hand 12 is located when the slowdown of the movable part 27 is started is the regulation target section A where the hand 12 is moved to have the vertical acceleration component av exceeding 0 (first threshold L1). Further, other sections, i.e., the section between the starting point Ps and the slowdown starting point Pw is a no-regulating section B where the hand 12 is moved to have the vertical acceleration component av at 0 or less (including a negative value).

In the regulation target section A, an inertia force in the opposite direction from the gravity direction acts on the wafer W to reduce the frictional force which acts on the contact surface between the wafer W and the substrate placing part 12a. In this state, when the wind pressure is applied to the wafer W, or when the centrifugal force or the inertia force acts on the wafer W, the positional deviation of the wafer W may easily occur. However, as described above, in the regulation target section A, the robot controlling part 41 moves the hand 12, while regulating the movement of the hand 12 including the horizontal velocity component vh exceeding 0 (second threshold L2). Therefore, in this section, the force which causes the positional deviation acting on the wafer W can be suppressed, and the occurrence of the positional deviation of the substrate placed on the substrate placing part 12a can be suppressed beforehand. In this embodiment, although the first threshold L1 and the second threshold L2 are 0, they are not limited to the value.

Further, as described above, in the no-regulating section B, the robot controlling part 41 moves the hand 12, while permitting the movement of the hand 12 including the horizontal velocity component vh exceeding 0 (second threshold L2). Therefore, in the section where the inertia force does not act on the wafer W and the section where the inertia force in the same direction as the gravity direction acts on the wafer W, the hand 12 can be promptly moved toward the ending point Pe.

Thus, the robot controlling part 41 moves the hand 12 along the path R which is different from the path Rt, when the linear path Rt on which the hand 12 is moved from the starting point Ps to the ending point Pe can be set, without interfering with surrounding environment. As described above, this path (actual moving path) R includes the no-regulating section B where the hand 12 is moved horizontally, and the regulation target section A where the hand 12 is moved vertically. Further, the path R is taught so that the minimum value of a deviation resistance coefficient during the movement of the hand 12 along the path R becomes larger than the minimum value of the deviation resistance coefficient during the movement of the hand 12 along path Rt. The deviation resistance coefficient can be expressed by the following Formula (1).

[Deviation Resistance Coefficient] = (1)

[Static Friction Coefficient between Wafer W and Substrate
Placing Part 12a] × [Vertical Acceleration of Wafer W] –

[Horizontal Acceleration of Wafer W]

Therefore, the occurrence of the positional deviation of the wafer W placed on the substrate placing part 12a can be suppressed beforehand.

Example Operation 2

Next, Example Operation 2 of the substrate transferring robot 5 of the substrate processing system 100 is described. In Example Operation 2, the robot controlling part 41 moves it on the moving path R in which the ending point Pe is set below the starting point Ps. In this Example Operation, the starting point Ps is set at the stage 3, and the ending point Pe is set at the carrier 110.

Figure 5A:
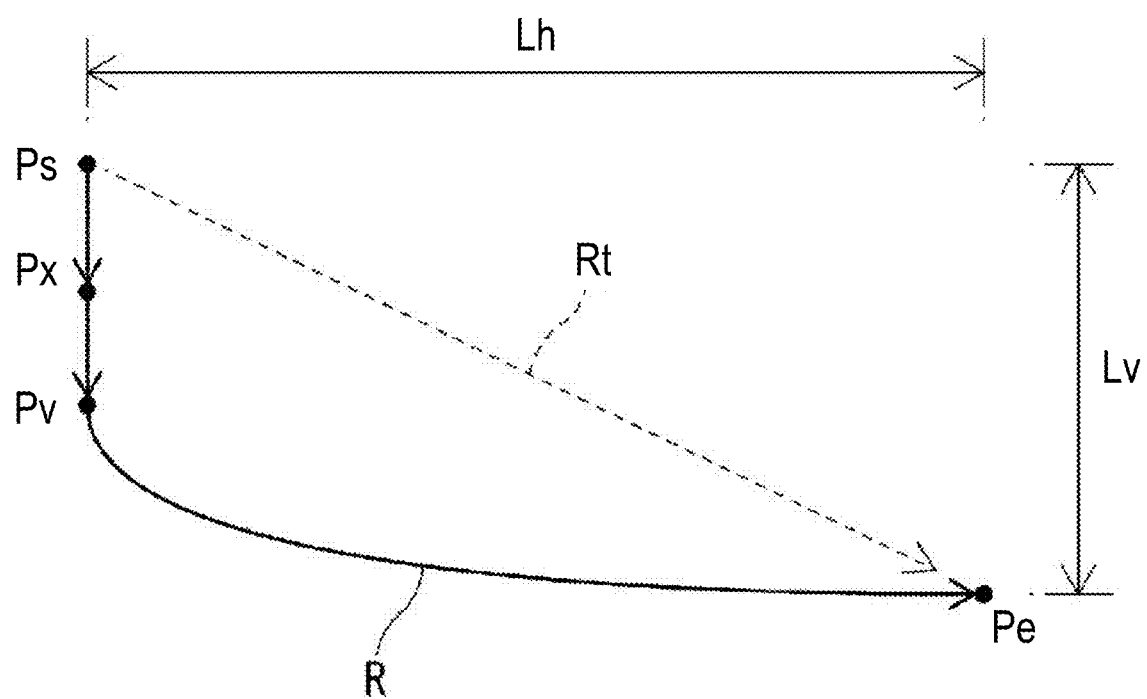
FIG. 5A is a view illustrating a moving path of the hand of the substrate transferring robot in Example Operation 2 of the substrate transferring robot of the substrate processing system of FIG. 1.
Figure 5B:
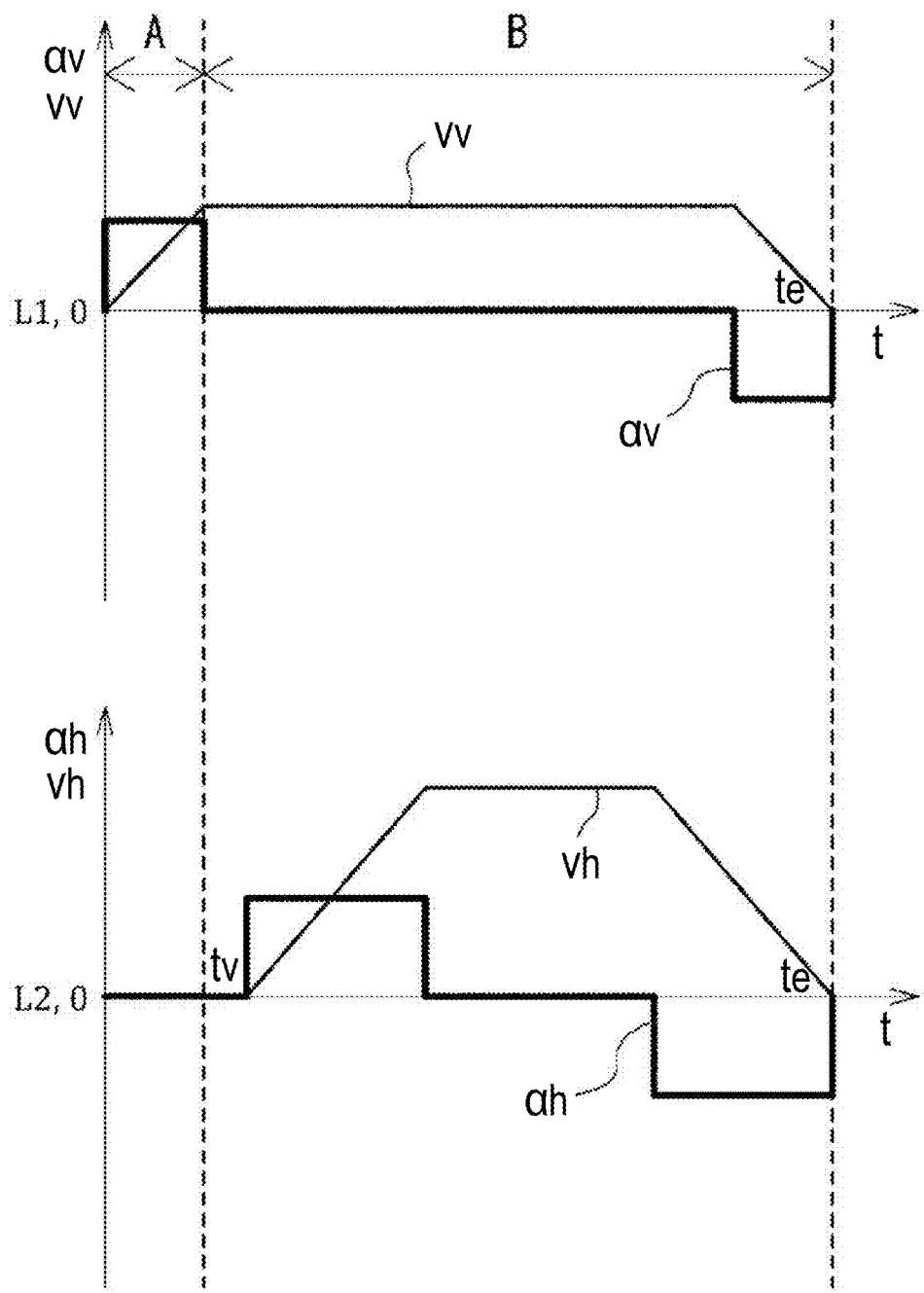
FIG. 5B is a view illustrating temporal changes in the velocity component and the acceleration component in the vertical direction of the hand of the substrate transferring robot which moves on the moving path of FIG. 5A, and temporal changes in the velocity component and the acceleration component in the horizontal direction.

FIG. 5A is a view illustrating the moving path R of the hand 12 of the substrate transferring robot 5 in Example Operation 2. FIG. 5B is a view illustrating temporal changes in the velocity component vv and the acceleration component av in the vertical direction of the hand 12 which moves on the moving path R illustrated in FIG. 5A, and temporal changes in the velocity component vh and the acceleration component ah in the horizontal direction.

Between Example Operation 1 and Example Operation 2, they are the same in the operation flow of Steps S10-S30, but different in the operation timing at which the hand 12 is moved, while regulating the movement of the hand 12 including the horizontal velocity component vh exceeding the second threshold L2.

In the operation regulating control of Example Operation 2, for example, when moving the hand 12 on the moving path R illustrated in FIG. 5A, the robot controlling part 41 first controls the vertical drive mechanism 26 to lower the movable part 27, and the robot controlling part 41 moves the hand 12 toward the waypoint Pv which is set below the starting point Ps. At this time, as illustrated in the upper graph of FIG. 5B, the robot controlling part 41 controls the vertical drive mechanism 26 to accelerate the movable part 27 toward the ending point Pe in the vertical direction, and when the speed reaches the target speed, it stops the acceleration of the movable part 27. That is, the value of the acceleration component av in the vertical direction of the hand 12 has a positive value for a certain period of time from the starting time of the movement, and it then changes to 0. Thus, when moving in the section between the starting point Ps and the waypoint Pv, the hand 12 does not have the horizontal velocity component vh, but has the vertical velocity component vv.

Then, when the hand 12 reaches the waypoint Pv located below the starting point Ps, the robot controlling part 41 controls the horizontal drive mechanism 21 to accelerate the hand 12 in the horizontal direction toward the ending point Pe, as illustrated in the lower graph of FIG. 5B. After that, when the speed reaches the target speed, the robot controlling part 41 stops the acceleration of the hand 12. That is, the horizontal acceleration component ah toward the ending point Pe of the hand 12 has a positive value for a certain period of time from the timing at which the hand 12 reaches the waypoint Pv, and it then changes to 0.

Then, when the hand 12 approaches the ending point Pe, the robot controlling part 41 controls the vertical drive mechanism 26 to slow down the movable part 27 (hand 12), and, further controls the horizontal drive mechanism 21 to slow down the hand 12, as illustrated in the lower graph of FIG. 4B. Then, the hand 12 is stopped at the timing te at which it reaches the ending point Pe. That is, the value of the vertical acceleration component av of the hand 12 changes from 0 to a negative value when the hand 12 starts the slowdown, and it then changes to 0 at the timing te at which the hand 12 reaches the ending point Pe. Further, the value of the horizontal acceleration component ah toward the ending point Pe of the hand 12 changes from 0 to a negative value when the hand 12 starts the slowdown, and it then changes to 0 at the timing te at which the hand 12 reaches the ending point Pe.

The section between the starting point Ps and an acceleration stopping point Px at which the hand 12 is located when the acceleration of the movable part 27 is stopped is the regulation target section A, and the other section is the no-regulating section B.

Example Operation 3

Next, Example Operation 3 of the substrate transferring robot 5 of the substrate processing system 100 is described. In Example Operation 3, the robot controlling part 41 moves on the moving path R in which the section to move the hand 12 in the horizontal direction, and the section to move the hand 12 in the vertical direction or the opposite direction to the vertical direction continuously alternate for more than twice.

Figure 6:
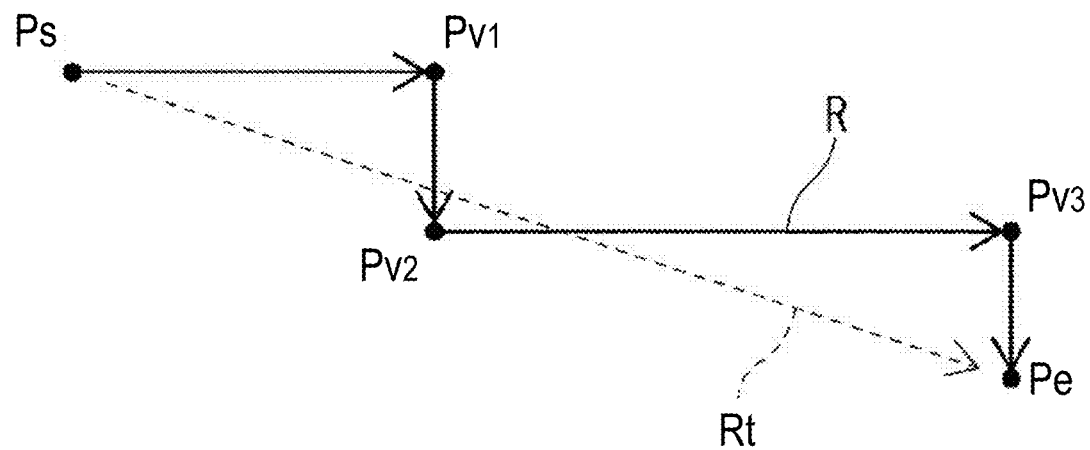
FIG. 6 is a view illustrating a moving path of the hand of the substrate transferring robot in Example Operation 3 of the substrate transferring robot of the substrate processing system of FIG. 1.

FIG. 6 is a view illustrating the moving path R of the hand 12 of the substrate transferring robot 5 in Example Operation 3.

Between Example Operation 1 and Example Operation 3, they are the same in the operation flow of Steps S10-S30, but different in the timing at which the hand 12 is moved, while regulating the movement of the hand 12 including the horizontal velocity component vh exceeding the second threshold L2.

In the operation regulating control of Example Operation 3, for example, when moving the hand 12 from the starting point Ps to the ending point Pe illustrated in FIG. 5A, the robot controlling part 41 first controls the horizontal drive mechanism 21 to move the hand 12 horizontally toward a first waypoint Pv1. Then, the robot controlling part 41 stops the hand 12 at the waypoint Pv1.

Next, the robot controlling part 41 controls the vertical drive mechanism 26 to move the hand 12 vertically toward the next waypoint Pv2 located below Pv1. Then, the robot controlling part 41 stops the hand 12 at the waypoint Pv1.

Further, the robot controlling part 41 repeats the alternation of the horizontal movement and the vertical movement to locate the hand 12 at the ending point Pe.

Therefore, in the regulation target section A where the hand 12 is moved so that the section has the acceleration component av in the vertical direction, the hand 12 can be moved, while regulating the movement of the hand 12 including the horizontal velocity component vh.

Example Operation 4

In Example Operations 1-3 described above, the robot controlling part 41 moves the hand 12 in the regulation target section A, while regulating the movement of the hand 12 including the horizontal velocity component vh exceeding 0 (second threshold L2). However, alternatively or additionally, the robot controlling part 41 may move the hand 12, while regulating the movement of the hand 12 including the horizontal acceleration component ah exceeding 0 (third threshold). Thus, in the regulation target section A where the positional deviation of the wafer W tends to occur easily, the occurrence of the positional deviation of the wafer W by the inertia force acting on the wafer W placed on the substrate placing part 12a can be suppressed beforehand. Note that the third threshold is not limited to 0.

Example Operation 5

Figure 7:
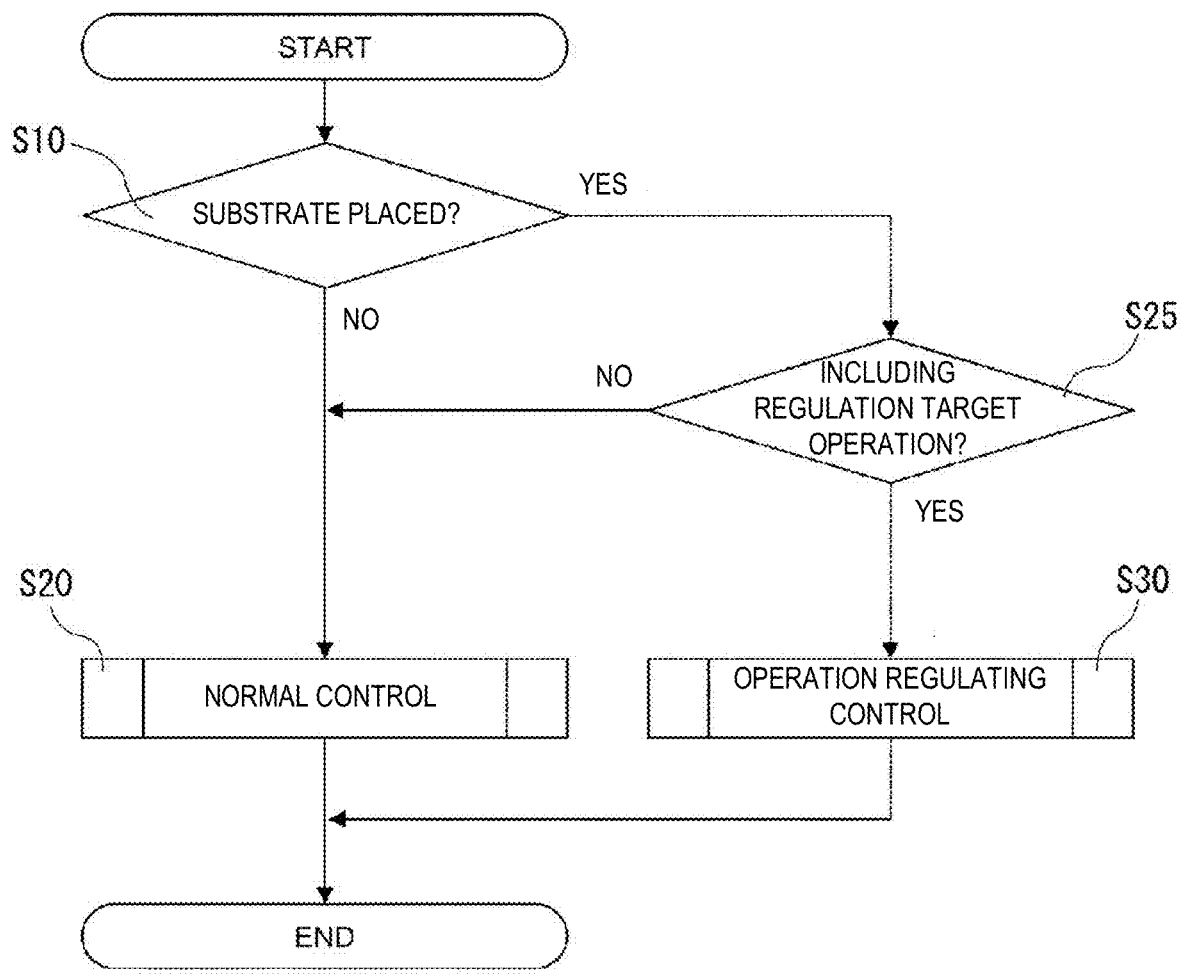
FIG. 7 is a flowchart illustrating Example Operation 5 of the substrate transferring robot of the substrate processing system of FIG. 1.

FIG. 7 is a flowchart illustrating Example Operation 5 of the substrate transferring robot 5. In Example Operations 1-4 described above, the moving paths R and Rt are paths which are taught beforehand when the starting point Ps and the ending point Pe are determined. Alternatively, the robot controlling part 41 may generate them according to the starting point Ps and the ending point Pe which are determined. Then, as illustrated in FIG. 7, in this example operation, if the robot controlling part 41 determines that the wafer W is placed on the substrate placing part 12a (Yes at Step S10), it further determines whether the operation of the hand 12 when the hand 12 is moved from the starting point Ps to the ending point Pe by the normal control includes a regulation target operation (Step S25). At this time, the robot controlling part 41 determines that the regulation target operation is included when the path Rt has a horizontal movement component Lh and a vertical movement component Lv (see FIGS. 4A and 5A). Alternatively, the robot controlling part 41 may determine that the regulation target operation is included, if a path where the hand 12 does not interfere with surrounding environment when the hand 12 is moved from the starting point Ps to the ending point Pe (i.e., a path where the operation of the hand 12 includes operation having the horizontal velocity component vh and the vertical velocity component vv) can be set. The operation having the horizontal and vertical velocity components vh and vv is operation for the horizontal drive mechanism 21 moving the movable part 27 upwardly and downwardly, and, at the same time, for the vertical drive mechanism 26 moving the hand 12 horizontally, for example, in the substrate transferring robot 5 which is the vertical articulated robot.

Then, if the robot controlling part 41 determines that the path Rt has only the horizontal movement component Lh or has only the vertical movement component Lv (No at Step S25), it performs the normal operation (Step S20). Thus, in the situation where the positional deviation of the wafer W placed on the substrate placing part 12a does not occur easily, the wafer W is promptly transferable to the ending point Pe.

On the other hand, if the robot controlling part 41 determines that the operation of the hand 12 in the normal control includes the regulation target operation (Yes at Step S25), it performs the operation regulating control. In this operation regulating control, the robot controlling part 41 generates the moving path R including the regulation target section A and the no-regulating section B. Then, the robot controlling part 41 controls so that the hand 12 moves on the moving path R.

It is apparent for the person skilled in the art that many improvements and other embodiments of the present disclosure are possible from the above description. Therefore, the above description is to be interpreted only as illustration, and it is provided in order to teach the person skilled in the art the best mode to implement the present disclosure. The details of the structures and/or the functions may be changed substantially, without departing from the spirit of the present disclosure.

What is claimed is:

1. A method of controlling a substrate transferring robot configured to move a hand of the substrate transferring robot from a given starting point to a given ending point, the method comprising:

when a straight-line path, where the hand is moved linearly from the starting point to the ending point without interfering with a surrounding environment, is settable, moving the hand along an actual moving path different from the straight-line path, wherein a minimum value of a deviation resistance coefficient expressed by the following formula while moving the hand along the actual moving path is larger than a minimum value of the deviation resistance coefficient while moving the hand along a linear path from the starting point to the ending point:

[a deviation resistance coefficient]=[a static friction coefficient between the substrate placed on the hand and the hand]×[a vertical acceleration of the substrate]−[a horizontal acceleration of the substrate].

* * * * *